United States Patent [19]

Kattmann

[11] Patent Number: 5,850,158
[45] Date of Patent: Dec. 15, 1998

[54] ACTIVELY REGULATED TOTEM POLE TTL OUTPUT STAGE

[75] Inventor: Kevin M. Kattmann, Greensboro, N.C.

[73] Assignee: Analog Devices, Inc., Norwood, Mass.

[21] Appl. No.: 805,346

[22] Filed: Feb. 24, 1997

[51] Int. Cl.$^6$ ....................................................................

[52] U.S. Cl. ........................... 327/375; 327/108; 327/482

[58] Field of Search ............................... 326/18, 26, 126, 326/127, 128, 89, 90, 78; 327/333, 375, 387, 482, 486, 488, 108

[56] References Cited

U.S. PATENT DOCUMENTS

| | | | |
|---|---|---|---|
| 4,514,651 | 4/1985 | Miller et al. | 326/18 |
| 5,101,124 | 3/1992 | Estrada | 307/475 |
| 5,287,019 | 2/1994 | Nonaka et al. | 307/475 |
| 5,444,395 | 8/1995 | Esgar | 326/73 |
| 5,572,152 | 11/1996 | Ueda | 326/126 |
| 5,574,391 | 11/1996 | Hanibuchi et al. | 326/126 |

OTHER PUBLICATIONS

AD9054, "8–bit, 200 MSPS A/D Converter", Preliminary Data Sheet, Analog Devices, Inc., 1996, pp. 1–8 and 16.

Primary Examiner—Tim Callahan
Assistant Examiner—Hai L. Nguyen
Attorney, Agent, or Firm—Koppel & Jacobs

[57] ABSTRACT

An all npn totem pole TTL output stage is provided with an active regulation circuit that continuously senses the voltage level at the output terminal and feeds it back to control the drive signal that is applied to the base of the bottom output transistor to switch the output state of the load quickly without wasting transient current and then scale back the drive signal during steady state operation to minimize wasted current. When the load is driven into its output low state, the active regulation initially holds the drive signal at a high level so that the load switches quickly. Once the output voltage has fallen low enough, the active regulation reduces the drive signal such that the bottom output transistor is held on the edge of conduction and does not saturate. In this state, the bottom output transistor pulls the output voltage down to approximately ground without conducting any appreciable amount of current. When the load is driven back into its high state, the bottom transistor is turned off before the top output transistor is turned on. This prevents transient drive current from being drawn from the voltage supply and returned directly to ground.

12 Claims, 5 Drawing Sheets

ACTIVELY REGULATED TOTEM POLE TTL OUTPUT STAGE

BACKGROUND OF THE INVENTION

1. Field of the Invention

This invention relates to TTL output stages and more specifically to active regulation of a totem pole TTL output stage to improve power efficiency.

2. Description of the Related Art

TTL output stages are used to drive a load in response to a TTL logic signal. The output stage isolates the TTL logic circuitry from the load, provides the desired voltage swing between the load's output high and low states, and supplies enough drive current to switch the load quickly. One type of output stage, commonly referred to as a totem pole TTL output stage, includes a pair of output transistors that are each actively driven to alternately source and sink drive current at an output terminal to drive the load between output high and low states.

As shown in FIG. 1, an all NPN totem pole TTL output stage 10 includes an npn output transistor QT, which has a base 12, a collector 14 that is tied to the voltage supply ($V_s$), and an emitter 16 that is connected to an output terminal 18, and an npn output transistor QB, which has a base 20, a collector 22 that is connected to the output terminal 18, and an emitter 24 that is tied to ground (GND). A load 26 is connected between the output terminal 18 and GND. A pair of driver circuits 28 and 30 generate a pair of complementary drive voltage signals V1,V2 that are applied to the bases of transistors QT and QB such that when QT is turning on QB is turning off and vice versa.

The driver circuits are represented schematically as having two-position switches St and Sb that switch between GND and voltage supplies VT and VB in response to ta logic signal to control the output state of the TTL driver stage 10. The values of the voltage supplies VT and VB and their series resistors RT and RB control how fast the load switches between its output high and low states and how much power is consumed by the output stage. The actual circuit implementation of the driver circuits will depend upon the TTL logic circuitry and the requirements of the load.

To switch the load high, switch St moves from position 2 to position 1 thereby applying the high voltage level VT to the base of transistor QT and switch Sb moves to position 2, which pulls the base of transistor QB down to ground. As transistor QT turns on and QB turns off, transient current is drawn from the voltage supply $V_s$ and driven into the load 26 causing it to switch to its output high state. To make the transitions quickly and to pull the output high state up close to the voltage supply, the driver circuit's voltage supply VT is suitably $V_s$. Once switched, transistor QT is self-regulating. If the load 26 is purely capacitive, it does not require steady state current to maintain its output high state and transistor QT turns off. If, however, load 26 is all or partly resistive, transistor QT remains on to supply the steady state current needed to maintain the output high state.

To switch the load 26 to its output low state, switch St is moved to position 2 (GND) thereby turning transistor QT off and switch Sb is moved to position 1, which sets the voltage level at the base of transistor QB at approximately VB. Transistor QB sinks current from the load 26 and returns it to ground thereby switching the load to its output low state. Unfortunately transistor QB is not self-regulating. Therefore, if level of voltage source VB were set equal to $V_s$, transistor QB would switch very quickly but would thereafter consume a large amount of steady state current. Hence, the voltage source VB is typically set at approximately a diode voltage above ground (0.8 v) to ensure that transistor QB turns on quickly but consumes a relatively low level of steady state current. This is typically accomplished by level shifting $V_s$ down to about a diode voltage.

In addition to the output stage's ability to isolate the logic circuitry, provide adequate swing, and switch the load quickly, its performance is measured by the amount of power consumed, and specifically the amount of power it consumes that does not interact with the load 26, which is referred to as "wasted power". Ideally, when the load is switched to its output high state all of the transient current drawn from the voltage supply $V_s$ is supplied to the load and, once switched, the steady state current in the output stage is zero. However, because the transition time of switches St and Sb are finite, transistors QT and QB are both turned on for some period of time. Thus, some portion of the transient current is returned directly to ground and, hence, does not interact with the load. Furthermore, when the load is driven into its output low state, the transistor QB saturates, i.e., its base-collector junction becomes forward biased. While saturated, transistor QB draws current from the voltage source VB, and thus indirectly from voltage source $V_s$, which increases the steady-state current level. In addition, it takes time for transistor QB to recover from saturation. This increases the period of time that both transistors QT and QB are turned on and, hence, increases the amount of transient current that does not interact with the load.

One known method of reducing the amount of wasted power in the output stage is to connect a Schottky diode across the base-collector junction of transistor QB. The Schottky diode clamps the voltage at the base of transistor QB, which prevents it from going into saturation. This reduces the steady state current drawn from VB and shortens the period of time that both output transistors are turned on. However, steady state current is now drawn through the Schottky diode itself. In addition, many of the newer processing technologies do not support the fabrication of a Schottky diode and although the diode reduces the time that both transistors are on, it does not eliminate it.

Another known approach is to provide switch Sb with a third position, in which it is connected to an intermediate voltage level VINT that is set at a level, suitably 0.6 v, that keeps transistor QB turned on without conducting appreciable current. The operation of the modified circuit is similar to that described above except that once the load has switched to its output low state, switch Sb moves from position 1 to position 3. As a result, the larger VB voltage is used to turn transistor QB on, which maintains switching speed, and the lower voltage VINT is used to hold the transistor QB on, which reduces the amount of steady-state current.

However, this approach requires additional switching circuitry in which timing is critical. If switch Sb is moved to position 3 too soon, the switching speed will be reduced and, conversely, if switch Sb is moved to position 3 too late, power will be wasted. Furthermore, if voltage VINT is too low, transistor QB may turn off prematurely and cause the load's output state to switch high thereby causing a logic error. This approach is also sensitive to loads that require sink current capability from the output stage. In addition, this approach does not reduce the transient current that flows directly to ground when both transistors QT and QB are turned on.

SUMMARY OF THE INVENTION

In view of the above drawbacks of the totem pole TTL output stage, the present invention reduces its power consumption while maintaining switching speed.

This is accomplished by providing an active regulation circuit that continuously senses the voltage level at the output terminal and feeds it back to control the level of voltage source VB such that a high level of drive current is applied to the base of transistor QB when needed to switch the output state of the load and is scaled back during steady state operation to minimize wasted current.

Specifically, in an all npn embodiment, when the load is driven from its output high to its output low state, the feedback initially holds the voltage source VB at its highest level so that the load switches quickly. Once the voltage at the output terminal has fallen low enough, the feedback reduces the voltage source VB such that output transistor is held on the edge of conduction. In this state, transistor QB pulls the voltage level at the output terminal down to approximately ground without conducting any appreciable amount of current. If transistor QB should start to turn off, the feedback will compensate and supply more drive current to turn QB back on and drive the output voltage back to ground. When the load is driven from its output low state to its output high state, transistor QB turns off before transistor QT turns on. This substantially eliminates the transient drive current that does not interact with the load. As a result, the amount of current that is wasted during both transient and steady state operation is reduced.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
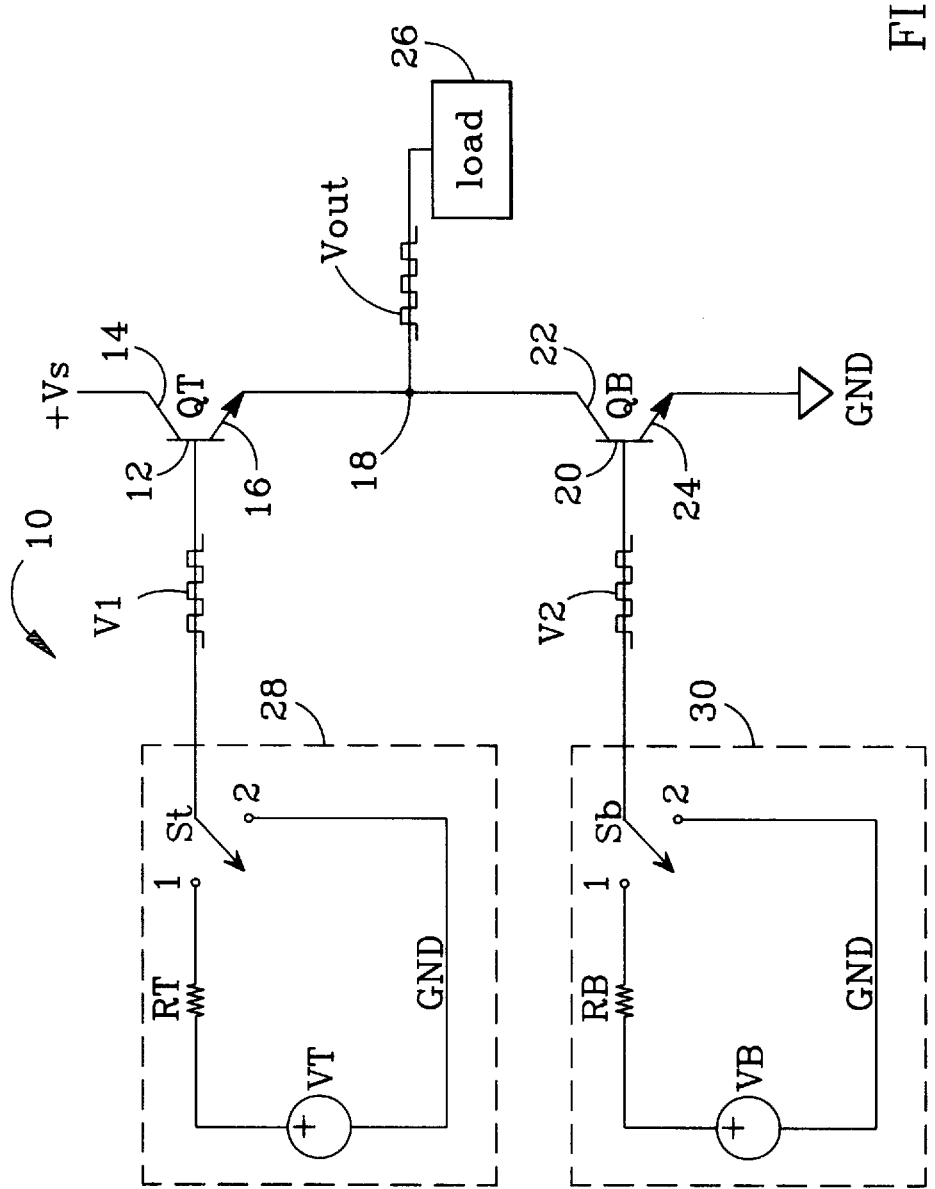
FIG. 1, as described above, is a simplified schematic diagram of a known all NPN totem pole TTL output stage.

The present invention provides a modification to the totem pole TTL output stage shown in FIG. 1, which reduces its power consumption while maintaining switching speed. This is accomplished by making the voltage source VB a function of the voltage $V_{out}$ at the output terminal 18 such that a high level of drive current is supplied to the base of output transistor QB when needed to switch the output state of the load 26 and is scaled back during steady state operation to minimize wasted current. This holds output transistor QB out of saturation and, when switching high, turns transistor QB off before transistor QT turns on thereby substantially eliminating the transient current that is returned directly to ground. This approach eliminates the need for a Schottky diode or a three-position driver circuit and provides improved power efficiency.

Figure 2:
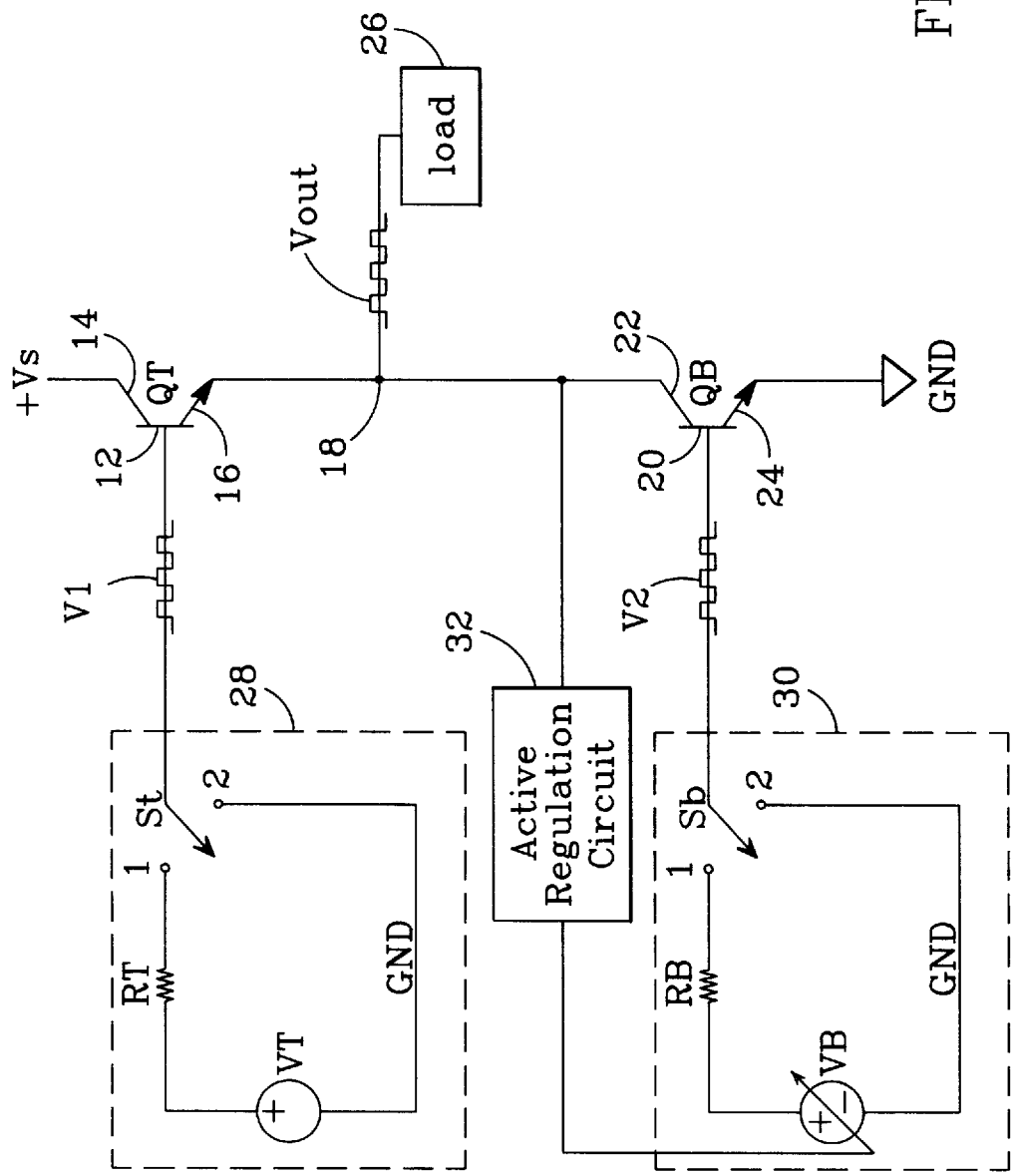
FIG. 2 is a simplified schematic diagram of an actively regulated all NPN totem pole TTL output stage in accordance with the present invention.

As shown in FIG. 2, the present invention modifies the known all npn totem pole output stage 10 shown in FIG. 1 by connecting an active regulation circuit 32 between the output terminal 18 and the voltage supply VB. The active regulation circuit 32 continuously senses the voltage $V_{out}$ at the output terminal 18 and feeds it back to control the level of voltage source VB. When the load 26 is in its output high state, switch Sb is in position 2 and the feedback control is disabled. To switch the load to its output low state, switch Sb is moved to position 1. Initially, the active regulation circuit 32 maintains the voltage source VB at its maximum level, suitably 0.8 v, so that a high level of drive current is supplied to the base of transistor QB thereby turning it on very fast and, hence, switching the load 26 to its output low state very quickly. The active regulation circuit 32 senses the output voltage $V_{out}$ as it falls from the output high state towards ground. Once $V_{out}$ has fallen low enough, the active regulation circuit 32 starts to pull the level of voltage supply VB down thereby reducing the drive current supplied at the base of transistor QB. This prevents the transistor QB from saturating.

Once the load 26 has reached its output low state, the active regulation circuit 32 maintains the voltage supply VB at approximately 0.6 v so that the transistor QB is held on the edge of conduction. This pulls $V_{out}$ to ground and holds the load 26 in its output low state without conducting an appreciable amount of current. If the transistor QB should try to turn off, the active regulation circuit 32 will increase the base drive thereby turning it back on and holding the output low. This dynamic feedback system avoids the problems associated with the known three-position switch approach. Furthermore, because transistor QB is held on the edge of conduction, when the load 26 is driven from its output low to its output high state, transistor QB turns off before transistor QT turns on. This substantially eliminates any transient current from flowing directly from the voltage supply $V_s$ to ground.

Figure 3:
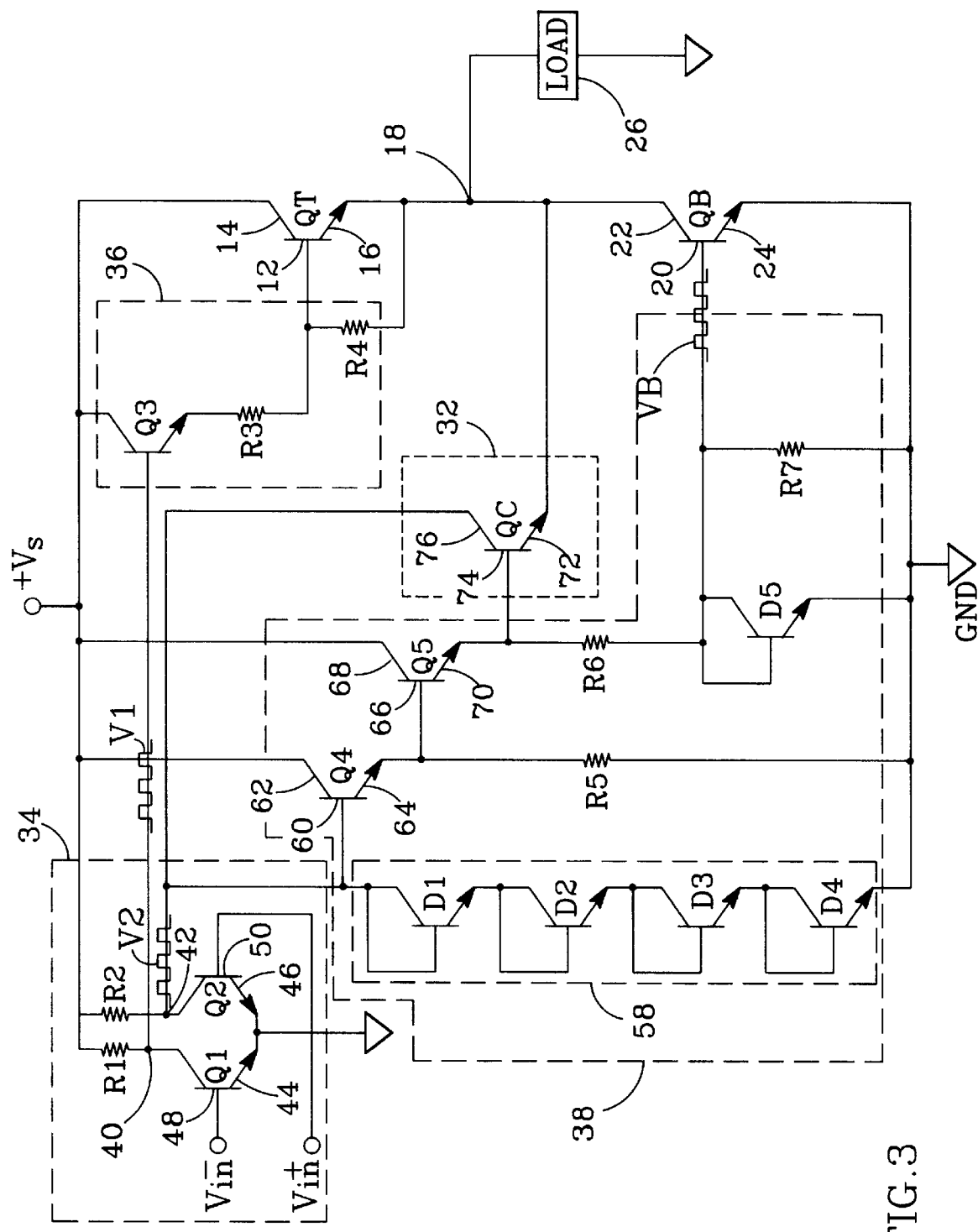
FIG. 3 is a schematic diagram of one embodiment of the actively regulated output stage shown in FIG. 2.
Figure 4:
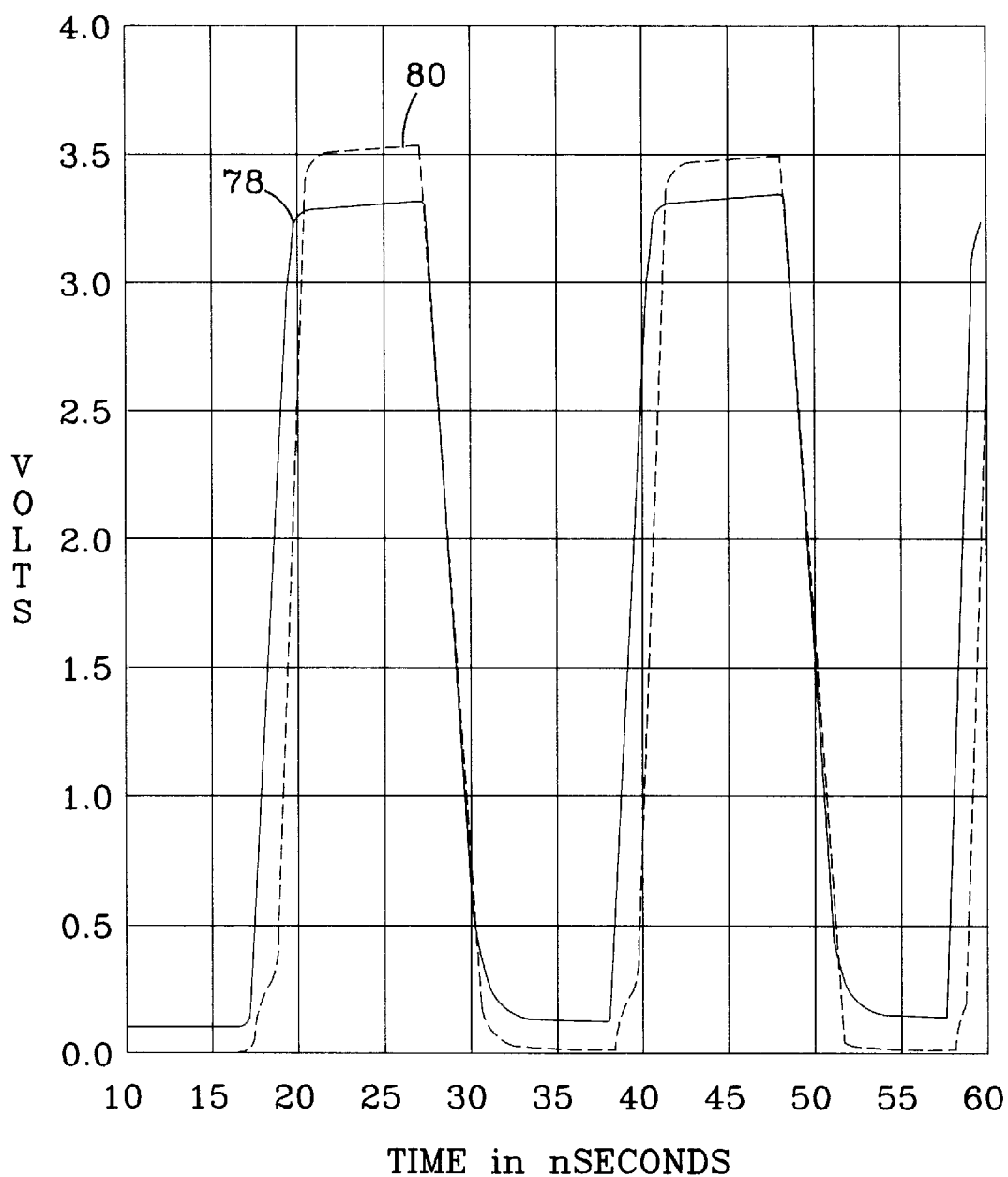
FIG. 4 is a plot of the output voltages for both the known and actively regulated output stages shown in FIGS. 1 and 3.
Figure 5A:
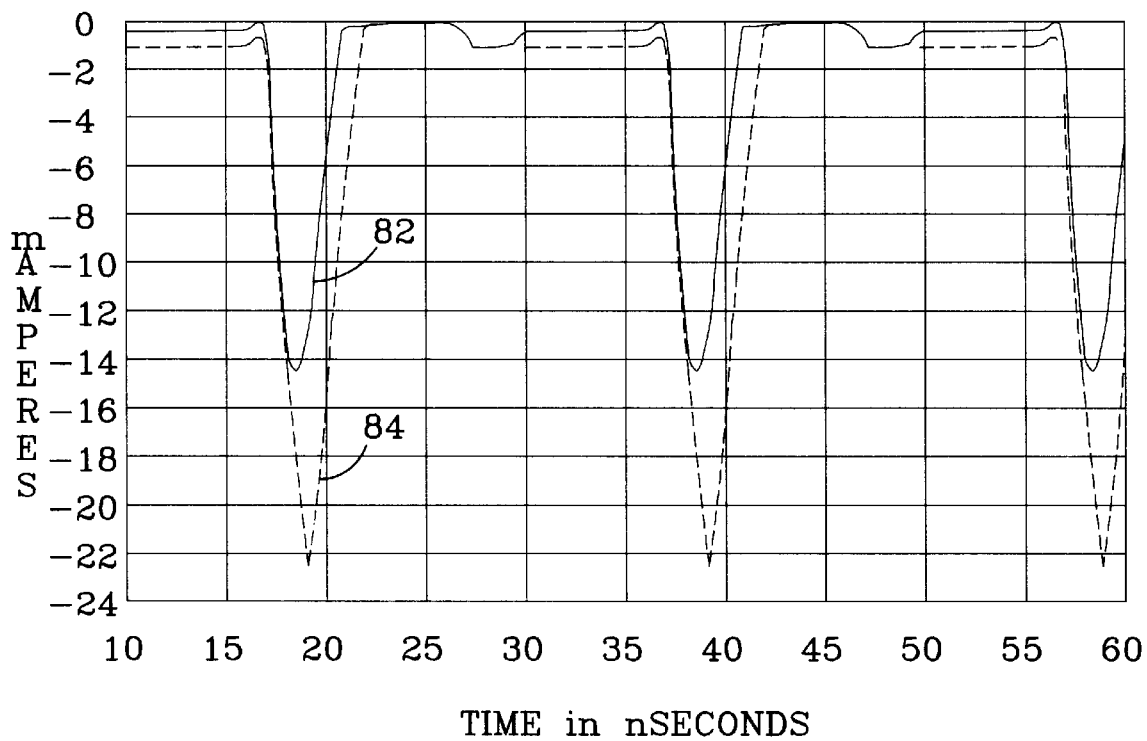
FIGS. 5a and 5b are respectively plots of the total current drawn from the supply and supplied to ground for both the output stage shown in FIG. 3 with and without the active regulation transistor.
Figure 5B:
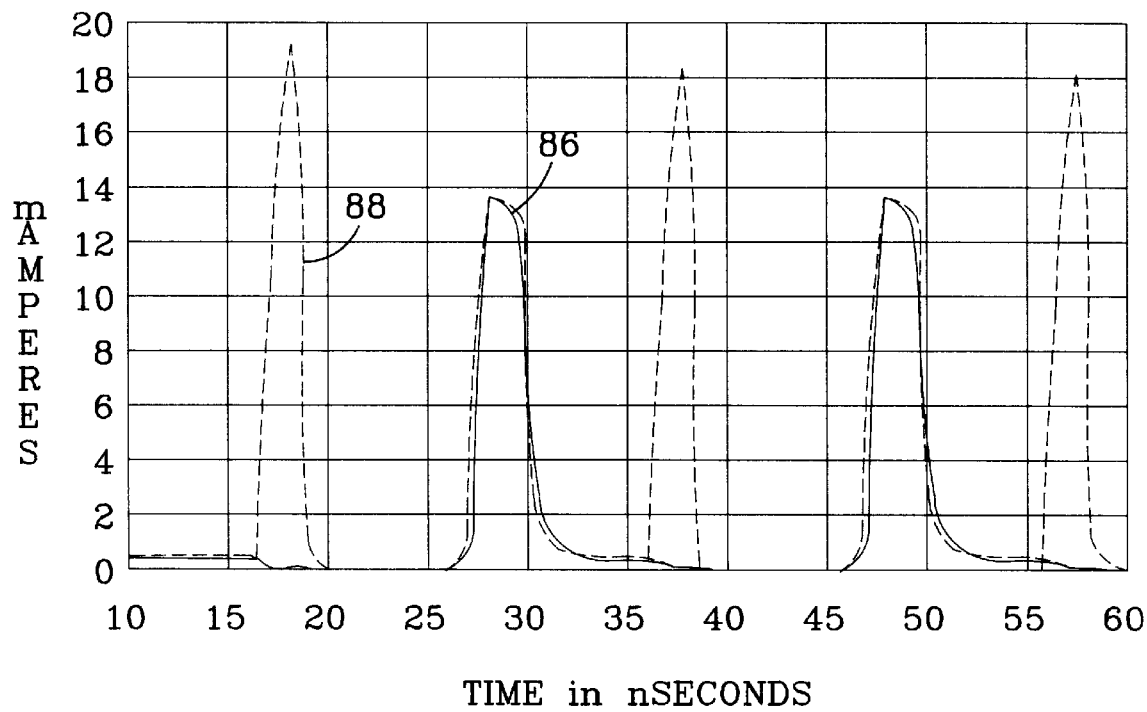

FIG. 3 illustrates one embodiment of the invention, in which the active regulation circuit 32, in the form of a single npn transistor QC, is added to the known AD9054 output stage produced by Analog Devices, Inc, the Assignee of the present invention. Although the implementation of the active regulation circuit in this particular output stage topology comprises only a single npn transistor, the differences in the drive control mechanisms and performance are dramatic as illustrated in FIGS. 4, 5a and 5b.

The AD9054 output stage includes a pair of npn output transistors QT and QB that are connected between the voltage supply $V_s$ and ground to supply drive current to the output terminal 18 in the same manner depicted in FIGS. 1 and 2. In order to supply the necessary drive current, transistors QT and QB are typically quite large. For example, the emitter sizes of transistors QT and QB are suitably ten times and twenty times a unit area.

The driver circuits 28 and 30 include a front-end driver circuit 34 that produces a pair of complementary drive voltage signals V1 and V2 that switch between high (VT) and low (GND) voltage levels in response to the output of a TTL logic circuit. The voltage VT is suitably the voltage supply $V_s$, typically 5 v. Drive voltage signal V1 is applied through a buffer 36 to the base 12 of output transistor QT. Drive voltage signal V2 is applied to a bias circuit 38 that clamps and level shifts the drive voltage signal's high level down to VB, approximately a fully-on diode voltage (0.8 volts). When the load is switched from its output high to its output low state, the level shifted voltage VB is applied to the base 20 of output transistor. Otherwise, the bias circuit passes the drive voltage signal's low level through to the base of transistor QB thereby tying it to ground.

In this particular topology, the front-end driver circuit 34 includes a pair of differentially connected npn transistors Q1 and Q2 whose collectors 40 and 42 are connected through pull-up resistors R1 and R2, respectively, to the voltage supply $V_s$ and whose emitters 44 and 46 are tied together to ground. The differential input voltage signal ($V_{in}$-, $V_{in}$+) produced by the TTL logic circuitry is applied across the bases 48 and 50 of transistors Q1 and Q2 to produce the complementary drive voltage signals V1 and V2 at their respective collectors.

The buffer 36 includes an npn transistor Q3 having a base that is connected to transistor Q1's collector 40, a collector that is tied to the voltage supply $V_s$ and an emitter that is connected to one side of a resistor R3, suitably 300 ohms. The other side of R3 is connected to the base 12 of output transistor QT. The buffer isolates the differential pair Q1 and QT from the parasitic capacitance of the large output transistor QT, which improves the switching speed of the differential pair. A resistor R4, suitably 10 k ohms, is connected across the base-emitter junction of output transistor QT to ensure that transistor QT turns on when the drive voltage signal V1 applied to the base of transistor Q3 switches high.

Bias circuit 38 includes a clamp 58 that is connected between transistor Q2's collector 42 and ground, which clamps the high level of drive voltage signal V2. As shown, clamp 58 includes four series connected diodes D1, D2, D3 and D4, which clamp V2 at approximately 3.2 volts. A pair of npn transistors Q4 and Q5 level shift the clamped drive voltage signal down by approximately two base-emitter voltages (1.6 volts). Transistor Q4 has a base 60 that is connected to transistor Q2's collector 42, a collector 62 that is tied to the voltage supply $V_s$, and an emitter 64 that is connected to one side of a resistor R5, suitably 45 k ohms, the other side of which is connected to ground. Transistor Q5 has a base 66 that is connected to transistor Q4's emitter 64, a collector 68 that is tied to $V_s$, and an emitter 70 that is connected to one side of a bias resistor R6, the other side of which is connected to output transistor QB's base 20. The resistance of bias resistor R6 is selected to control the amount of drive current supplied to the base of output transistor QB and, hence, control the switching speed of the load. A suitable resistance for R6 is 1200 ohms. A diode D5 and a pull-down resistor R7 are connected across the base-emitter junction of output transistor QB to respectively set the high and low levels of drive signal V1 that are applied to the base of transistor QB at the clamped and level shifted voltage VB and ground.

When the TTL logic circuitry is in a steady state high condition, drive transistor Q2 is turned on and drive transistor Q1 is turned off. Thus, the drive voltage signal V2 at transistor Q2's collector 42 is pulled down to approximately ground reference potential. As a result, the bias circuit 38 is turned off and only a small amount of leakage current flows through pull-down resistor R7, which pulls the base 20 of output transistor QB to ground thereby turning it off. At the same time, the drive voltage signal V1 that is buffered through to the base 12 of output transistor QT is switched to its high level VT. In the steady state high condition, the voltage $V_{out}$ at output terminal 18 is one base-emitter voltage below the voltage at the base of transistor QT. As previously discussed, if load 26 is purely capacitive, transistor QT will be held on the edge of conduction so that the load remains in its output high state without supplying any additional current. If load 26 is partially resistive, transistor QT will remain on to supply enough steady state current to maintain the load in its output high state.

When switching high to low, the buffered drive voltage signal V1 applied to output transistors QT's base 12 switches from its high level to its low level, which turns transistor QT off. Drive voltage signal V2 switches from its low level to its high level, which is clamped at approximately 3.2 volts. The clamped voltage level is then level shifted down by transistors Q4 and Q5 to approximately to 1.6 volts at the emitter 70 of transistor Q5. The resulting voltage drop across resistor R6 produces a bias current that sets the voltage VB across diode D5 at approximately 0.8 volts. This turns on output transistor QB, which discharges the load 26 thereby switching it to its output low state. When switching high to low, output transistor QT turns off before output transistor QB turns on, thus avoiding the problem of transient current being drawn from the voltage supply and return directly to ground.

During the steady state low condition, the clamp 58 holds the voltage level at approximately 3.2 volts such that the voltage across diode D5 remains at 0.8 volts. Thus, output transistor QB remains fully-on and becomes saturated, i.e., its base-collector junction becomes reverse biased. As a result, output transistor QB draws a significant amount of steady state current from the voltage supply $V_s$.

When the TTL circuitry switches high, output transistor QT is turned on and output transistor QB is turned off. However, because the voltage levels applied to the respective output transistors cannot be switched instantaneously, both transistors are turned on for some period of time. This causes current to be drawn from the voltage supply and returned directly to ground without interacting with the load 26. This problem is further exacerbated by the fact that output transistor QB is saturated, and thus requires a longer period of time to recover before it can be turned off.

Up to this point, the output stage circuitry and its operation describe the AD9054 output stage. In accordance with the invention, the active regulation circuit 32 comprises a single npn transistor QC. The transistor QC has an emitter 72 that senses the voltage level $V_{out}$ at the output terminal 18, a base 74 that is tied to a reference voltage in the bias circuit 38, shown here as the emitter 70 of transistor Q5, and a collector 76 that is connected to drive transistor Q2's collector 42 to selectively draw current through pull-up resistor R2 to reduce the high level of voltage drive signal V2. Because transistor QC is connected in a feedback loop, it must be relatively fast in order to maintain the proper phase relationship between the sensed voltage and the correction. In this particular topology, transistor Qc has a 1× emitter area so that it is much faster than either output transistor.

When the output stage is in a steady state high condition, the voltage at the output terminal 18 is higher than the voltage at transistor Q5's emitter 70, which turns control transistor QC off. As a result, transistor QC does not draw any current through pull-up resistor R2 and thus does not effect the drive voltage signal V2. When the output state switches from high to low, transistor QC's base-emitter junction initially remains reverse biased, and thus has no effect the drive voltage signal VB that is applied to the base of output transistor QB. When the output voltage has fallen far enough, i.e., approximately a base-emitter voltage below the reference voltage, transistor QC becomes forward biased and begins to draw current through the pull up resistor R2. This has the effect of pulling the clamped voltage level down by a few tenths of a volt, which in turn has the effect of reducing the voltage across diode D5 from approximately 0.8 volts to approximately 0.6 volts so that the base-emitter junction of output transistor QB is held on the edge of conduction. This holds output transistor QB out of saturation, which substantially reduces the amount of steady state current that is drawn from the voltage supply.

If output transistor QB should try to turn off, the dynamic feedback provided by control transistor QC will sense the corresponding rise in the output voltage and reduce the amount of current drawn through pull-up resistor R2. This has the effect of increasing the voltage across diode D5, and thus the drive current supply to output transistor QB so that it is held on the edge of conduction. Furthermore, because output transistor QB is held on the edge of conduction when the output stage switches back to a high state, transistor QB turns off before transistor QT can turn on, which substantially eliminates the problem of transient current being drawn from the voltage supply and returned directly to ground without interacting with the load 26.

FIGS. 4, 5a and 5b compare the performance of the known AD9054 output stage with and without the control transistor QC when driving a purely capacitive load of 10 picofarads at a switching rate of a 100 mega samples per cycle. FIG. 4 is a plot of the output voltage responses 78 and 80 versus time for the output stage with and without the control transistor QC, respectively. As shown, the switching times are equivalent. Thus, the active regulation provided by the invention does not have any negative effects on the performance of the output stage. The saturation problem of the known output stage shows up as a kink in the voltage response 80 when switching from low to high. Until transistor QB recovers from saturation, it steals a portion of the drive current from the load, which causes the kink or nonlinearity in the transition of the voltage response. Conversely, the transition in the voltage response 78 produced by the modified output stage is very smooth because transistor QB is turned off before the transition begins.

FIGS. 5a and 5b are respectively plots of the total currents 82 and 84 drawn from the voltage supply $V_s$ and the total currents returned to ground 86 and 88 for the known and modified output stages, respectively. Starting at approximately time T=22 nanoseconds, the load is switched to its output high state. Because the test load is purely capacitive, the levels of steady state current drawn from the voltage supply and returned to ground are essentially zero. At approximately time T=27 nanoseconds, the load is switched to its output low state. As shown in FIG. 5b, a large transient current is returned to ground to discharge the load. As shown in FIG. 5a, output transistor QB is driven fully on and draws a small amount of current from the voltage supply. However, once switched the steady state current 84 in the known output stage remains at the same level while the steady state current 82 in the modified output stage returns to essentially zero.

A dramatic difference is seen when the load is driven from its low to its high state at approximately T=37 nanoseconds. Because both output transistors QB and QT are turned on in the known output stage, the current 88 drawn from the voltage supply exhibits a very large transient spike. A portion of this transient current is supplied to the load but a large portion of the transient current is returned directly to ground as shown in the large transient spike in current 88 in FIG. 5b. The modified output stage draws much less transient current 82 from the voltage supply and supplies all of it to the load, as evidenced by the lack of any transient spike in the current 86 that is returned to ground. The power consumption of the modified output stage when driving the 10 picofarad load is 9.5 milliwatts versus 15.5 milliwatts for the known output stage and 2 milliwatts versus 9.5 milliwatts when operating no load.

While several illustrative embodiments of the invention have been shown and described, numerous variations and alternate embodiments will occur to those skilled in the art. For example, the invention is equally applicable to an all PNP totem pole TTL output stage. Such variations and alternate embodiments are contemplated, and can be made without departing from the spirit and scope of the invention as defined in the appended claims.

I claim:

1. A TTL output stage for driving a load, comprising:
    a differentially-connected pair of transistors for receiving a differential input signal;
    first and second output transistors coupled to respectively source current to and sink current from said load wherein said first output transistor is responsive to a first one of said differentially-connected pair;
    a clamp coupled to a second one of said differentially-coupled pair to generate a clamped signal;
    a level-shift circuit coupled to said clamp to receive said clamped signal and generate a level-shifted output and wherein said second output transistor is responsive to said level-shifted output; and
    a control transistor coupled across said second output transistor and further coupled to said second one of said differentially-coupled pair, said control transistor thereby coupled to compare a signal across said load to said level-shifted output and, in response, to draw current from said second one of said differentially-coupled pair when necessary to hold said second output transistor out of saturation and on the edge of conduction.

2. The TTL output stage of claim 1, further including a buffer transistor that couples said first output transistor to said first one of said differentially-connected pair.

3. The TTL output stage of claim 1, wherein said level-shift circuit includes first and second transistors coupled to shift said clamped signal to said level-shifted output.

4. The TTL output stage of claim 1, further including first and second pull-up resistors that are respectively coupled to said first and second ones of said differentially-connected pair.

5. The TTL output stage of claim 1, further comprising:
    a diode;
    a pull-down resistor coupled in parallel with said diode and across said second output transistor; and
    a bias resistor that couples said level-shifted output to said diode and said pull-down resistor;
    said diode and said pull-down resistor respectively setting high and low signal levels applied to said second output transistor and said bias resistor controlling the current supplied to said second output transistor.

6. A TTL output stage for driving a load, comprising:
    a differentially-connected pair of transistors for receiving a differential input signal;
    first and second output transistors coupled to respectively source current to and sink current from said load wherein said first output transistor is responsive to a first one of said differentially-connected pair;
    a level-shift circuit that couples said second output transistor to a second one of said differentially-connected pair;
    a diode;
    a pull-down resistor wherein said diode and said pull-down resistor are coupled across said second output transistor to respectively set high and low signal levels; and a control transistor coupled across said second output transistor and further coupled to said second one of said differentially-coupled pair, said control transistor thereby coupled to compare a signal across said load to a signal of said level-shift circuit and, in response, to draw current from said second one of said differentially-coupled pair when necessary to hold said second output transistor out of saturation and on the edge of conduction.

7. The TTL output stage of claim 6, further including:

a clamp coupled to said second one of said differentially-coupled pair to limit its signal; and a bias resistor inserted between said level-shifted output and said second output transistor to control the current of said second output transistor.

8. The TTL output stage of claim 6, further including a buffer transistor inserted between said first output transistor and said first one of said differentially-connected pair.

9. A TTL output stage for driving a load, comprising:

a supply voltage terminal;

an output terminal for connection to a load;

a ground terminal;

a first npn output transistor having a base, a collector that is connected to the supply voltage terminal, and an emitter that is connected to the output terminal;

a second npn output transistor having a base, a collector that is connected to the output terminal, and an emitter that is connected to the ground terminal;

a driver circuit comprising a pair of differentially connected npn transistors having collectors that are respectively connected to first and second drive terminals on one side of first and second pull-up resistors, the other sides of which are connected to the supply voltage terminal, emitters that are connected to the ground terminal, and bases that respond to a differential input signal to generate first and second complementary drive voltage signals at the first and second drive terminals, respectively, that switch between low and high drive levels;

a buffer circuit that is connected between the first drive terminal and the base of the first npn output transistor to buffer the driver circuit so that a) when the first drive voltage signal switches from the low to the high drive level, the first transistor draws transient current from the supply voltage terminal and supplies it to the output terminal to switch the load to a high load voltage level, and b) when the first drive voltage switches from the high to the low drive level the first transistor is turned off;

a bias circuit that is connected between the second drive terminal and the base of the second npn output transistor to clamp and level shift the second drive voltage signal's high drive level to provide a reference voltage at an internal terminal and to provide a drive voltage at the base of the second transistor that is approximately a fully-on diode voltage so that a) when the second drive voltage signal switches from the low to the high drive level, sufficient base current is driven into the second transistor's base to turn it on such that it sinks transient current from the load and returns it to the ground terminal thereby switching the load to a low load voltage level, and b) when the second drive voltage signal switches from the high to the low drive level, the second transistor is turned off; and an npn regulation transistor having a base that is connected to the bias circuit's internal terminal, a collector that is connected to the second drive terminal, and an emitter that is connected to the output terminal to sense the load voltage such that when the load voltage falls to approximately a diode voltage below the reference voltage at its base the regulation transistor turns on thereby drawing current from the supply voltage terminal through the second pull-up resistor such that the second drive voltage signal's high drive level is reduced thereby reducing the drive voltage at the base of the second output transistor so that it is held near the edge of conduction whereby a) the second output transistor does not saturate when the load voltage is driven from the high to the low load voltage level thereby reducing the level of steady state current in the output stage and b) the second transistor is turned off before the first transistor is turned on when the load voltage is driven from the low to the high load voltage level thereby reducing the amount of transient current that does not interact with the load.

10. The TTL output stage of claim 9, wherein the bias circuit comprises:

a clamp that is connected between the second drive terminal and the ground terminal to limit the second drive voltage signal's high drive level to a value less than the first drive voltage signal's high drive level, a level shifting circuit that further shifts the high drive level of the second drive voltage signal to the reference voltage at the internal terminal, a bias resistor that is connected between the internal terminal and the base of the second transistor to control the amount of base current supplied to the second transistor;

a diode that is connected between the second transistor's base and the ground terminal, said diode providing the fully-on diode voltage until the regulation transistor turns on, at which point the diode applies a lower voltage to the base of the second transistor that holds it near the edge of conduction; and a pull-down resistor that is connected between the second transistor's base and the ground terminal, which pulls the voltage at the second transistor's base towards ground thereby turning it off when the second drive signal is switched to its low drive level.

11. The TTL output stage of claim 1, wherein said first and second output transistors and said control transistor are bipolar transistors and the emitter and base of said control transistor are respectively coupled to the collector and base of said second output transistor.

12. The TTL output stage of claim 6, wherein said first and second output transistors and said control transistor are bipolar transistors and the emitter and base of said control transistor are respectively coupled to the collector and base of said second output transistor.

* * * * *